(12) United States Patent
Buhler et al.

(10) Patent No.: US 6,967,431 B2
(45) Date of Patent: Nov. 22, 2005

(54) PIEZOELECTRIC TRANSDUCERS AND METHODS OF MANUFACTURE

(75) Inventors: Steven A. Buhler, Sunnyvale, CA (US); Karl A. Littau, Palo Alto, CA (US); John S. Fitch, Los Altos, CA (US)

(73) Assignee: Palo Alto Research Center Inc., Palo Alto, CA (US)

(*) Notice: Subject to any disclaimer, the term of this patent is extended or adjusted under 35 U.S.C. 154(b) by 29 days.

(21) Appl. No.: 10/664,352

(22) Filed: Sep. 16, 2003

(65) Prior Publication Data

US 2004/0130242 A1 Jul. 8, 2004

Related U.S. Application Data

(60) Provisional application No. 60/433,510, filed on Dec. 13, 2002, provisional application No. 60/433,512, filed on Dec. 13, 2002, and provisional application No. 60/433,515, filed on Dec. 13, 2002.

(51) Int. Cl.[7] .............................................. H01L 41/08
(52) U.S. Cl. ........................ 310/330; 310/331; 347/68
(58) Field of Search ....................... 310/328, 330–332; 347/68–71

(56) References Cited

U.S. PATENT DOCUMENTS

| | | | | |
|---|---|---|---|---|
| 4,613,875 A | | 9/1986 | Le et al. ...................... 346/140 |
| 6,476,336 B1 | * | 11/2002 | Takeuchi et al. ............. 200/181 |
| 6,495,945 B2 | * | 12/2002 | Yamaguchi et al. ......... 310/324 |
| 6,584,660 B1 | * | 7/2003 | Shimogawa et al. ....... 29/25.35 |
| 6,734,603 B2 | * | 5/2004 | Hellbaum et al. .......... 310/330 |

FOREIGN PATENT DOCUMENTS

| | | |
|---|---|---|
| EP | 0 787 588 A2 | 8/1997 |
| EP | 0 803 918 A1 | 10/1997 |

* cited by examiner

*Primary Examiner*—Mark Budd
(74) *Attorney, Agent, or Firm*—Nola Mae McBain

(57) ABSTRACT

A system and method of operation for a piezoelectric transducer is described which utilizes a mesa structure interposed between a piezoelectric material element and a chamber diaphragm. The mesa structure may further comprise a series of mesa openings at least partially filled with adhesive and mesa grooves. The system can be used as a sensor where a net motion to the diaphragm causes a net charge equal to the sum of the charges on each piezoelectric diaphragm. Alternatively, the system can be used as an actuator wherein an applied voltage causes movement of the piezoelectric transducer and the chamber diaphragm.

40 Claims, 11 Drawing Sheets

PIEZOELECTRIC TRANSDUCERS AND METHODS OF MANUFACTURE

RELATED APPLICATIONS

This application claims benefit of U.S. Provisional Patent Application 60/433,510 filed Dec. 13, 2002, entitled "Product and Process for Bonding Porous Materials to Substrates" with inventors Buhler and Littau, U.S. Provisional Patent Application 60/433,515 filed Dec. 13, 2002 entitled "Product and Process for Bonding Porous Materials to Substrates" with inventors Buhler and Littau, and U.S. Provisional Patent Application 60/433,512 filed Dec. 13, 2002, entitled "Piezoelectric Transducers and Methods of Manufacture" with inventors Buhler, Littau, and Fitch hereby incorporated by reference in their entirety herein.

This application is related to:

U.S. patent application Ser. No. 10/664,169 entitled "A Product and Process for Bonding Porous Materials to Substrates" filed concurrently herewith, with inventors Buhler and Littau.

U.S. patent application Ser. No. 10/665,052 entitled "A Product and Process for Bonding Porous Materials to Substrates" filed concurrently herewith, with inventors Buhler and Littau.

U.S. patent application Ser. No. 10/664,472 entitled "Piezoelectric Transducers" filed concurrently herewith, with inventors Buhler, Littau, Fitch, Andrews, Burke, Nystrom, and Schmachtenberg.

BACKGROUND

This invention relates generally to piezoelectric transducers, and more specifically provides an improved piezoelectric diaphragm and method of manufacture, which can be used as a sensor, an actuator, or in fluid ejection applications.

Piezoelectric transducers have many applications. In particular, piezoelectric diaphragms have been employed as pressure sensors, in speakers for audio equipment, and fluid ejection, fluid pumping, and printing applications. The basic principles for the operation of piezoelectric transducers are as follows. A piezoelectric material having electrodes is bonded or deposited on one or both sides of a diaphragm material to form a piezoelectric actuated diaphragm. Diaphragms with piezoelectric material on one side only are referred to as unimorph diaphragms, while diaphragms with piezoelectric material on both sides are referred to as bi-morph diaphragms. The piezoelectric transducer can then be utilized in two modes.

The first mode is to apply a voltage or charge to the electrodes which creates a field across the piezoelectric material. The field will cause a strain in the piezoelectric material and then the piezoelectric material together with the diaphragm moves. This first mode is very useful in applications such as fluid ejection applications or in audio equipment. In both cases, the piezoelectric diaphragm can be caused to oscillate in a useful manner. In the former case, to provide a force which will cause fluid to eject from a chamber and in the second case to cause a speaker diaphragm to oscillate and to reproduce sound.

The second mode of operation is the converse of the first. The piezoelectric diaphragm is used is subjected to a force, pressure, or displacement which will cause the diaphragm together with the piezoelectric material to bend or move. The physical movement of the diaphragm along with the piezoelectric material then causes polarization to take place in the piezoelectric material and a charge to be present on the electrodes. The diaphragm can thus be used as a sensor.

In all of these applications efficiency of the piezoelectric transducer is important as well as the cost of producing the piezoelectric transducer. Efficiency and cost trade-offs are often made in production of such systems. For instance, larger piezoelectric material elements may be used than are strictly necessary to compensate for potential misalignment problems in manufacture. However, using larger piezoelectric material elements may degrade the performance of the resultant piezoelectric transducer. There is a need, therefore, for piezoelectric transducers which can be simply manufactured with good yields and have the best possible efficiency characteristics.

There is provided a piezoelectric transducer which utilizes a mesa structure for attachment of the piezoelectric material to improve manufacturability and efficiency of the piezoelectric transducer.

Further advantages will become apparent as the following description proceeds.

SUMMARY

Briefly stated and in accordance with the present invention, there is provided a piezoelectric transducer having a chamber diaphragm with a mesa adjacent to the upper surface of the chamber diaphragm, and a piezoelectric material element adjacent to the upper surface of the mesa. The mesa may be composed of a mesa edge support and a mesa interior, where the mesa interior may be a variety of materials including air, liquids, or solids. The mesa may also include a plurality of mesa openings, at least partially filled with adhesive to facilitate bonding of the piezoelectric material element to the mesa.

Figure 1:
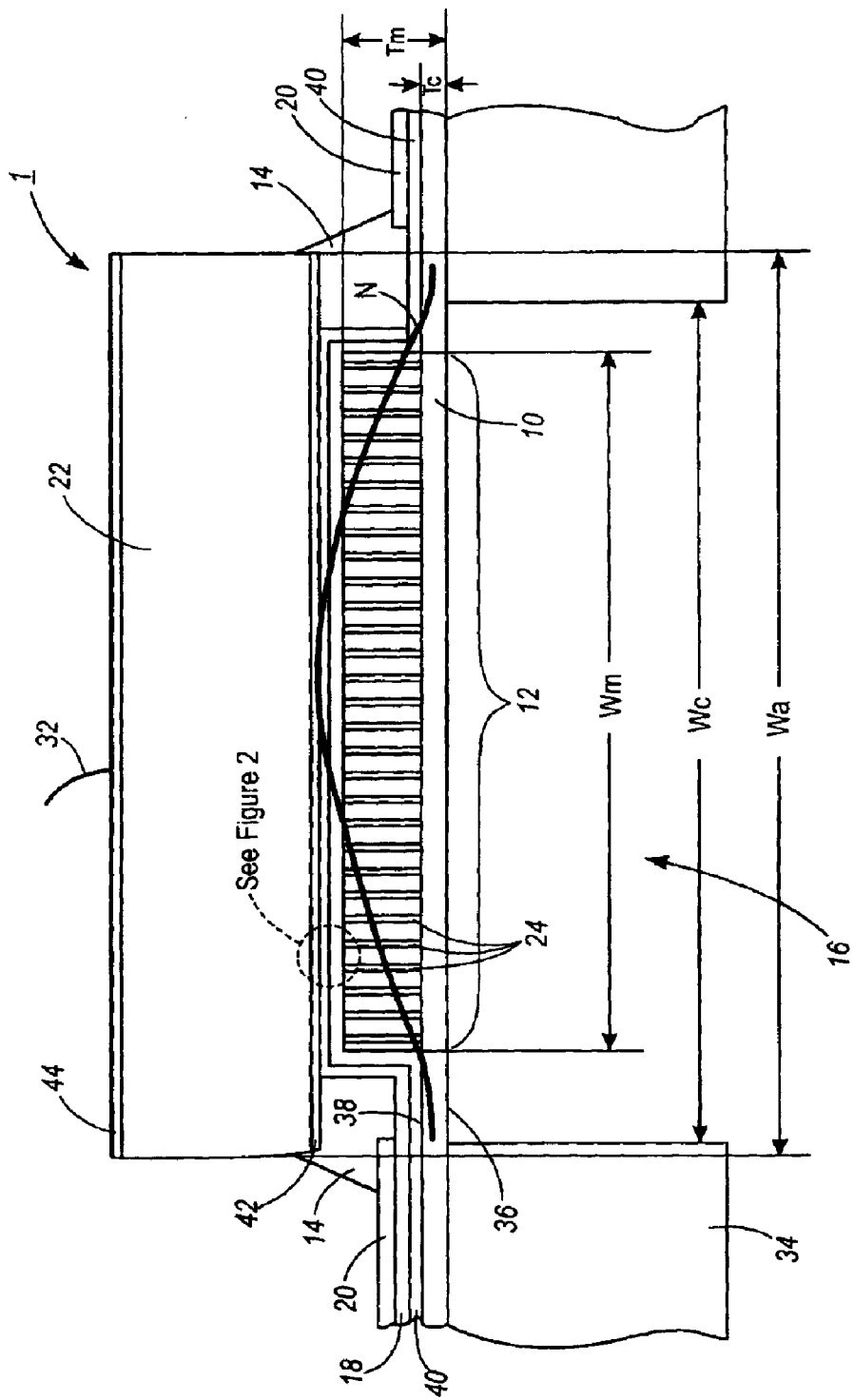
FIG. 1 is a cross-sectional view of an embodiment of a piezoelectric transducer according to the present invention.

While the present invention will be described in connection with a preferred embodiment and/or method of use, it will be understood that it is not intended to limit the invention to that embodiment and procedure. On the contrary, it is intended to cover all alternatives, modifications and equivalents as may be included within the spirit and scope of the invention as defined by the appended claims.

Alpha-Numeric List of the Elements

Dr reservoir depth
F force
L zero bias line
N neutral surface
q− negative charge
q+ positive charge
Tc chamber diaphragm thickness
Tm mesa thickness
Tm 1 mesa thickness
Tm 2 mesa thickness
V polarization vector
Wa piezoelectric material width
Wa 1 piezoelectric material width
Wa 2 piezoelectric material width
Wc chamber diaphragm width
Wm mesa width
Wr reservoir width
1 piezoelectric transducer
10 chamber diaphragm
12 mesa
14 adhesive
16 chamber
18 electrical interconnect layer
20 dielectric layer
22 piezoelectric material element
24 mesa opening
26 mesa edge support
28 mesa interior
30 mesa groove
32 electrical contact
34 chamber support structure
36 chamber diaphragm lower surface
38 chamber diaphragm upper surface
40 insulative layer
42 electrical contact layer
44 electrical contact layer
50 substrate
52 apertures
54 adhesive
56 substrate top surface
58 porous material
60 piezoelectric material element
62 mesa
64 insulative layer
66 electrical interconnect layer
68 adhesive
70 electrical contact layer
72 electrical contact layer
74 electrical contact

DETAILED DESCRIPTION

Figure 2:
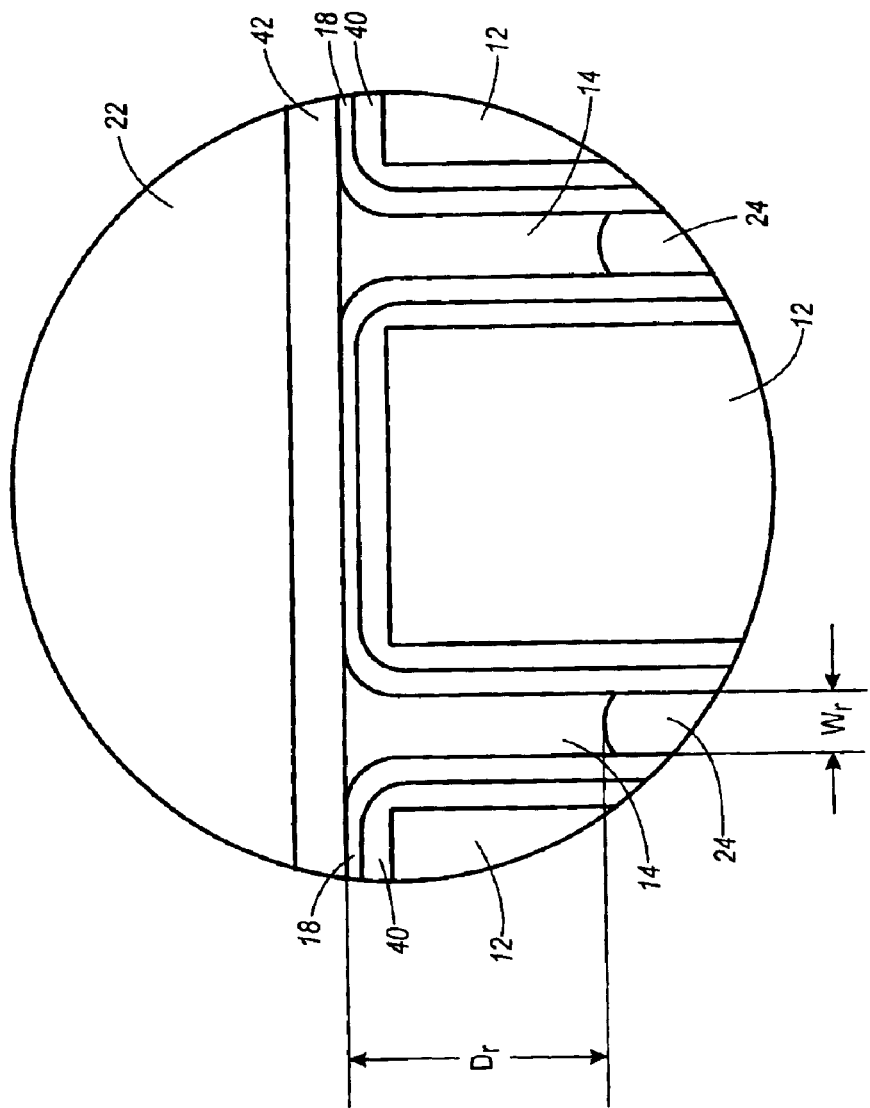
FIG. 2 is an enlargement of a portion of the piezoelectric transducer shown in FIG. 1.
Figure 3:
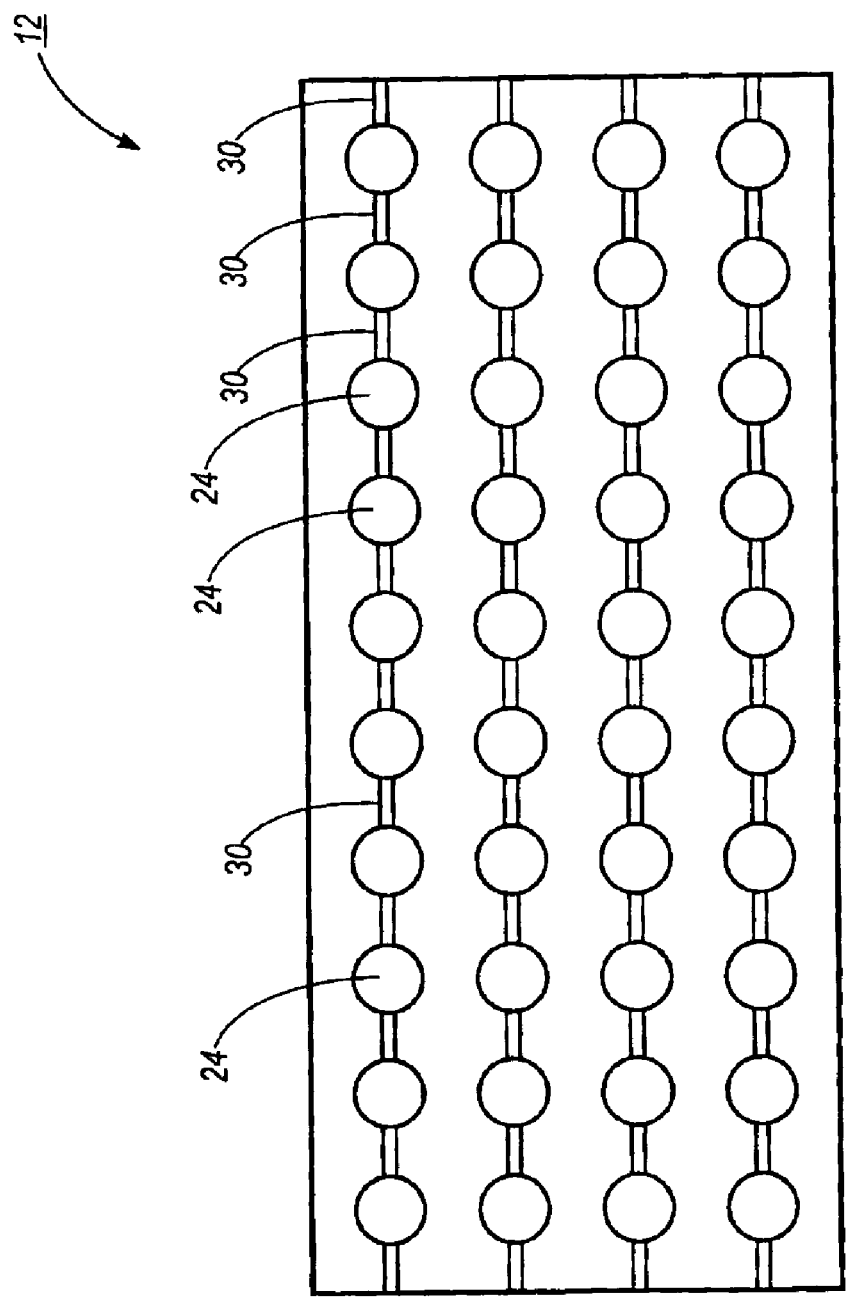
FIG. 3 is a top view of a mesa structure in the embodiment shown in FIG. 1.

Turning now to FIGS. 1–3, a piezoelectric transducer 1 having a chamber diaphragm 10 over a chamber 16 with chamber support structure 34 is shown. It should be noted that the shape of the chamber diaphragm 10 and the piezoelectric material element 22 are for exemplary purposes only and many variants are possible.

The chamber diaphragm 10 has a chamber diaphragm width Wc and a chamber diaphragm thickness Tc. The chamber diaphragm 10 may be made from a variety of materials such as metals, silicon, sapphire, crystals, plastics and other substantially conductive, non-conductive, and semi-conductive materials. The chamber diaphragm 10 is at least partially covered on one surface by a mesa 12 having a mesa width Wm and a mesa thickness Tm. The mesa width Wm is shown as being less than the chamber diaphragm width Wc, however, the mesa width Wm may vary from approximately 50% of the chamber diaphragm width Wc to approximately 150% of the chamber diaphragm width Wc although it should be noted that performance may be better from approximately 60% of the chamber diaphragm width Wc to approximately 100% of the chamber diaphragm width Wc.

One surface of the mesa 12 has a piezoelectric material element 22 bonded to it using an adhesive 14. Alternatively, the piezoelectric material element 22 may be attached with using solder, thin film epoxies or the like. The piezoelectric material element 22 has a piezoelectric material width Wa. The piezoelectric material width Wa is shown as being larger than both the mesa width Wm and the chamber diaphragm width Wc, however the piezoelectric material width Wa can be a variety of sizes and will be optimized for the process parameters and the ultimate function. For instance, it may be desired when building sensors that the piezoelectric material width Wa be small relative to the chamber diaphragm width Wc. It is also possible in some cases for the piezoelectric material width Wa to be smaller that mesa width Wm.

The mesa width Wm, determines the effective attachment edge of the piezoelectric material when the piezoelectric material width Wa is greater than the mesa width Wm. That is, even though the piezoelectric material width Wa is larger than the mesa width Wm, the chamber diaphragm 10 will react to the piezoelectric material element 22 as if it had a piezoelectric material width Wa equal to the mesa width Wm. This therefore defines an effective attachment perimeter and size of the piezoelectric material element 22 to be the perimeter and size of the mesa 12 regardless as to the actual shape and size of the piezoelectric material element 22, as long as the piezoelectric material element 22 is larger than or overhangs the mesa 12. The mesa 12 can be constructed and aligned more precisely to the chamber, compared to the piezoelectric material element 22, due to common manufacturing methods which achieve an optimum positioning of the mesa 12, and therefore optimum positioning and effective width of the piezoelectric material element 22, for a given chamber diaphragm width Wc, when the piezoelectric material element 22 is larger than or overhangs the mesa 12.

The mesa 12 may be made out of a variety of materials such as the same material as used for the chamber diaphragm 10, oxides, nitrides, polyimides and other substantially insulative materials, metals and other substantially conductive materials and ceramics, among others. The mesa thickness can be any size so long as the mesa 12 and the chamber diaphragm 10 can still be bent by the piezoelectric material element 22. The minimum mesa thickness Tm chosen, when the piezoelectric material width Wa is greater than the mesa width Wm, should be such that the sum of the thicknesses of the mesa 12, insulative layer 40, and electrical interconnect layer 18 is greater than the sum of the thicknesses of the insulative layer 40, electrical interconnect layer 18, and the dielectric layer 20. This will assure that the piezoelectric material element 22 is in direct contact only on the surface of the mesa 12 and not the top of the dielectric layer 20. The mesa thickness Tm for a particular application will be determined by performance and manufacturability constraints. If the mesa thickness Tm is greater than approximately 10% of the chamber diaphragm thickness Tc, there is an added mechanical advantage to the piezoelectric material element 22. This is because expansion or contraction of the piezoelectric material element 22 will create a greater bending moment on the chamber diaphragm 10 when the piezoelectric material element 22 is further displaced from the neutral surface N of the diaphragm 10. The neutral surface N is defined as the surface within the diaphragm 10 and the adjoining structures, such as mesa 12, where the shear stress passes through zero. That is, the shear stresses are compressive on one side of the neutral surface N and tensile on the other. There are many combinations of dimensions and properties of the chamber diaphragm 10, mesa 12, and piezoelectric material element 22 that will provide acceptable performance characteristics.

Although not necessary, the mesa 12 additionally may have a series of mesa openings 24, as shown in FIGS. 1–3 to provide for enhanced bonding of the piezoelectric material element 22 to the mesa 12. The mesa openings are shown in FIG. 1 as extending substantially through the mesa 12 towards the chamber diaphragm 10 however, the mesa openings 24 need extend only partially into the mesa 12 to a depth of at least approximately 0.5 microns. The mesa openings 24 should be at least approximately 0.5 microns wide, evenly distributed and occupy no more than approximately 50% of the surface area of the mesa 12. As can be seen in the enlarged view of FIG. 2, the insulative layer 40 and the electrical interconnect layer 18 may partially fill the mesa openings 24, in that case to compensate for this the mesa openings 24 should be increased such that the resultant reservoir width Wr and reservoir depth Dr become at least approximately 0.5 microns. A top view of the mesa 12 is shown in FIG. 3. As can be seen, the mesa 12 may also have mesa grooves 30 connecting the mesa openings 24. The mesa grooves should also be at least approximately 0.5 microns wide.

The mesa openings 24 provide for enhanced bonding of the piezoelectric material element 22 to the mesa 12 by serving as an adhesive 14 reservoir during the bonding operation. This allows the adhesive 14 to be present in sufficient quantities to allow it to seep into the somewhat porous material of the piezoelectric material element 22 during the curing operation while retaining a sufficient quantity of the adhesive 14 to bond the piezoelectric material element 22 to the mesa 12. Therefore the volume of the mesa openings 24 and/or mesa grooves 30 should provide sufficient reservoir volume to supply the necessary adhesive 14. The particular size and depth of the mesa openings will be determined by the amount of adhesive reservoir needed, the viscosity of the adhesive, and manufacturing constraints. The mesa grooves 30 may further serve as an aid to avoid trapping air bubbles as the adhesive is applied and cured by providing a channel for air bubbles to escape.

Interposed between the mesa 12 and the piezoelectric material element 22 is an insulative layer 40 and an electrical interconnect layer 18. The insulative layer 40 may not be necessary and may be left out of some implementations. Some implementations may utilize a substantially conductive chamber diaphragm 10 and mesa 12 as the electrical contact layer in which case both the insulative layer 40 and the additional electrical interconnect layer 18 may be omitted. Alternatively, if only the chamber diaphragm 10 or the mesa 12 is substantially conductive then select portions of the electrical interconnect layer 18 and/or the insulative layer 40 may be omitted. The insulative layer 40 is used to insulate, if necessary, the chamber diaphragm 10 from any electrical signals carried on the electrical interconnect layer 18. The insulative layer 40 is commonly made out of dielectric materials having sufficient resistivity such that leakage currents are kept to an acceptably small value and with suitable mechanical properties such that the film remains intact over time and with acceptable manufacturability. Resistivities greater than $10^{10}$ ohm-cm are commonly used. Some examples of suitable dielectric materials include silicon dioxide, silicon nitride, silicon oxynitride, epoxy resins, polyimides and mylar layers although other materials may be used if they have suitable properties.

The chamber diaphragm 10 and chamber diaphragm support structure 34 may be made out of any material having adequate stiffness and strength and manufacturability. The material stiffness, as measured by well-know parameters such as mechanical elastic modulus and poisson ratio, would be chosen for a given application to best achieve design goals such as stiffness of the chamber 16, which is measured by pressure change per volume change of the chamber. For instance, silicon, polysilicon, silicon nitride, stainless steel or silicon dioxide are commonly used as diaphragms although other materials such as plastics, metals such as aluminum and nickel or others, glass, or epoxy resins may also be used. The chamber diaphragm 10 has two surfaces, a chamber diaphragm lower surface 36 which faces the chamber 16 and a chamber diaphragm upper surface 38 which is opposed to the chamber diaphragm lower surface 36 and faces the mesa 12.

The piezoelectric material element 22 may be made out of any material which is ferroelectric in nature or electrostrictive or any material which changes physical dimension as the electric field in the material is changed. For instance, various ceramic materials may be used such as lead-zirconate-titanate (PZT), lead-titanate (PbTiO2), barium-titanate (BaTiO3), lead-magnesium-niobium-titanate (PMNPT) or crystalline materials such as zinc-oxide (ZnO), aluminum-nitride (AlN), quartz, lithium-tantalate (LiTaO3) and lithium-niobate (LiNbO2). Any of these materials may be used in forms that are polycrystalline or single crystal in nature. Also polymeric materials such as polyvinylidene fluoride (PVDF) and its co-polymers or other polymers may be used.

The adhesive 14 for attaching the piezoelectric material element 22 to the mesa 12 can be any variety of adhesives having sufficient bonding strength and manufacturing characteristics such as viscosity, surface wetting, etc. Some examples are epoxy resins or acrylic resins or others. It should be noted that the adhesive 14 forms a very thin residual layer between the mesa 12 and the piezoelectric material element 22 but forms a thick cushion under the edges of the piezoelectric material element 22 where the piezoelectric material element 22 extends beyond the mesa 12. Adhesives which have an elastic modulus less than approximately $\frac{1}{5}^{th}$ the elastic modulus of the piezoelectric material 22 will work with the mesa 12 to provide an effective piezoelectric material element 22 width equal to the mesa width Wm by allowing any portion of the piezoelectric material element 22 extending beyond the mesa 12 to flex freely without impacting the chamber diaphragm 10.

The electrical interconnect layer 18 is for making electrical contact with the piezoelectric material element 22. The electrical interconnect layer 18 can be made out of a wide variety of conductive materials as is known in the art. For instance, nickel, aluminum, copper, titanium alloys, or indium tin oxide may be used although other materials having sufficient conductivity may also be used.

Electrical contact 32 is also shown for making electrical contact with the piezoelectric material element 22. The electrical contact 32 can also be made out of a wide variety of conductive materials as is known in the art, such as a wire bond as depicted in FIG. 1. For instance aluminum, copper, gold, and nickel may be used although other materials having sufficient conductivity may also be used.

To facilitate electrical contact between the piezoelectric material element 22 and both electrical contact 32 and electrical interconnect layer 18, the piezoelectric material element 22 includes two electrical contact layers 42, 44 on opposing surfaces. The two electrical contact layers 42, 44 are pre-deposited conductive layers in intimate contact with the piezoelectric material element 22. The electrical contact layers 42, 44 can also be made out of a wide variety of conductive materials as is known in the art. For instance, nickel, aluminum, copper, titanium alloys, or indium tin oxide may be used although other materials having sufficient conductivity may also be used.

Figure 4:
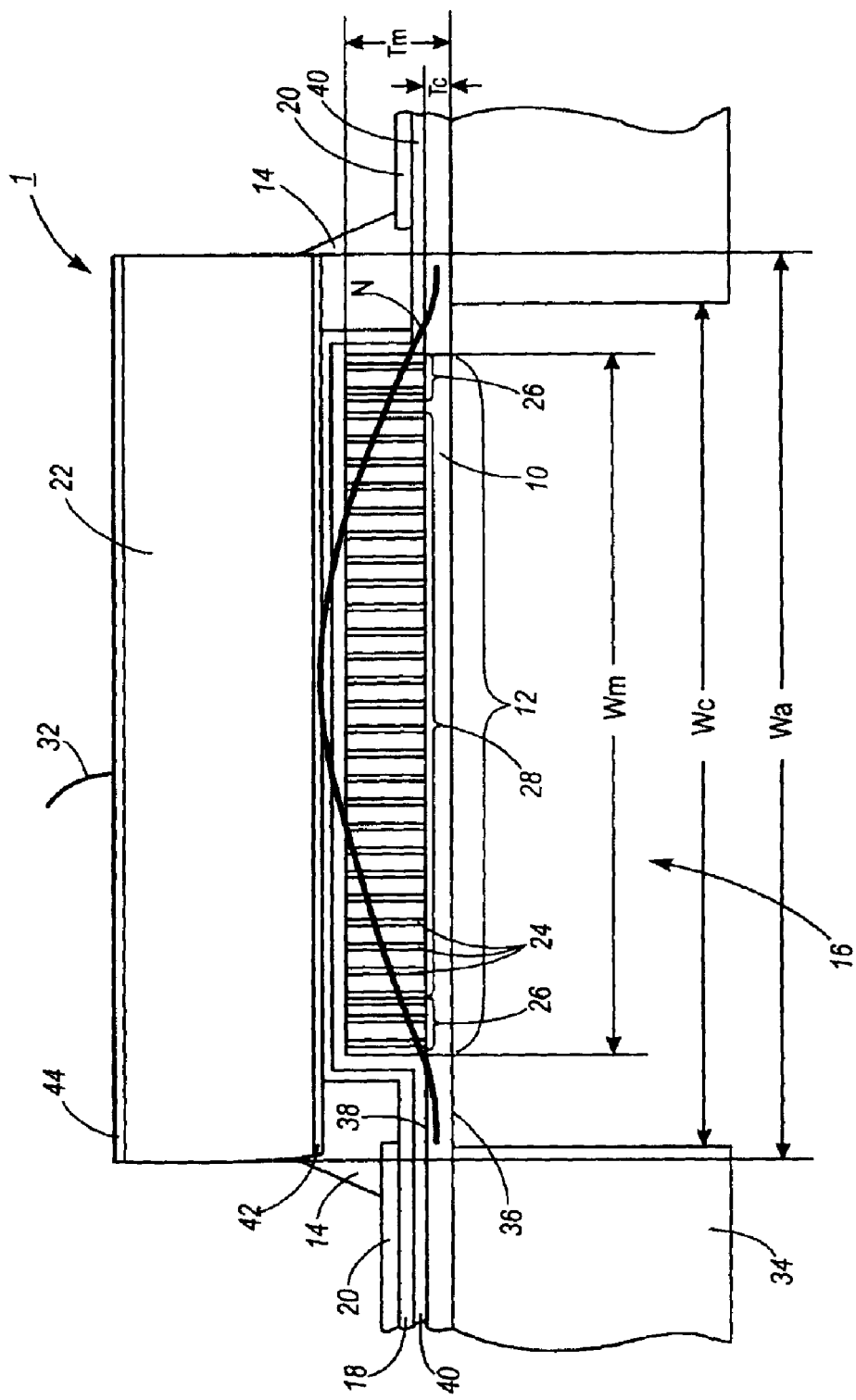
FIG. 4 is a cross-sectional view of a second embodiment of a piezoelectric transducer according to the present invention.
Figure 5:
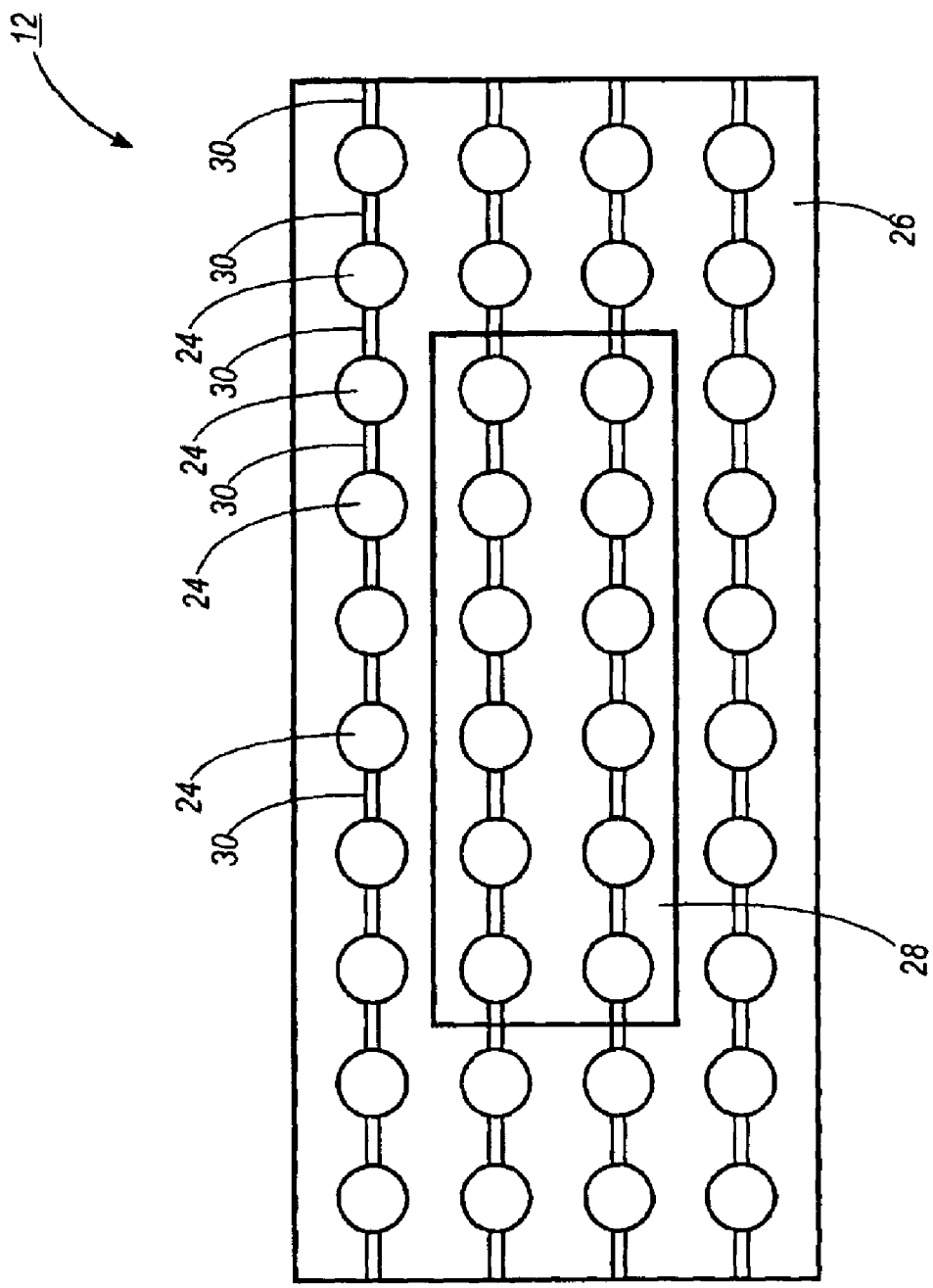
FIG. 5 is a top view of a mesa structure in the embodiment shown in FIG. 4.

FIGS. 4 and 5 show an alternative embodiment of a piezoelectric transducer 1 having a chamber diaphragm 10 over a chamber 16 with chamber support structure 34. As the figures contain many similar elements, like reference numerals will be used to reference like elements. It should be noted that the shape of the chamber diaphragm 10 and the piezoelectric material element 22 are for exemplary purposes only and many variants are possible.

The chamber diaphragm 10 has a chamber diaphragm width Wc and a chamber diaphragm thickness Tc. The chamber diaphragm 10 is at least partially covered on one surface by a mesa 12 having a mesa width Wm and a mesa thickness Tm. The mesa width Wm is shown as being less than the chamber diaphragm width Wc, however, the mesa width Wm may vary from approximately 50% of the chamber diaphragm width Wc to approximately 150% of the chamber diaphragm width Wc, although it should be noted that performance may be better from approximately 60% of the chamber diaphragm width Wc to approximately 100% of the chamber diaphragm width Wc.

One surface of the mesa 12 has a piezoelectric material element 22 bonded to it using an adhesive 14. The piezoelectric material element 22 has a piezoelectric material width Wa. The piezoelectric material width Wa is shown as being larger than both the mesa width Wm and the chamber diaphragm width Wc, however the piezoelectric material width Wa can be a variety of sizes and will be optimized for the process parameters and the ultimate function. For instance, it may be desired when building sensors that the piezoelectric material width Wa be small relative to the chamber diaphragm width Wc. It is also possible in some case for the piezoelectric material width Wa to be smaller that mesa width Wm. The mesa width Wm, determines the effective attachment edge of the piezoelectric material element 22 when the piezoelectric material width Wa is greater than the mesa width Wm. That is, even though the piezoelectric material width Wa differs from the mesa width Wm, the chamber diaphragm 10 will react to the piezoelectric material element 22 as if it had a piezoelectric material width Wa equal to the mesa width Wm. This therefore defines an effective attachment perimeter and size of the piezoelectric material element 22 to be the perimeter and size of the mesa 12 regardless as to the actual shape and size of the piezoelectric material element 22, as long as the piezoelectric material element 22 is larger than or overhangs the mesa 12. The mesa 12 can be constructed and aligned more precisely to the chamber, compared to the piezoelectric material element 22, due to common manufacturing methods which achieve an optimum positioning of the mesa 12, and therefore optimum positioning and effective width of the piezoelectric material element 22, for a given chamber diaphragm width Wc, when the piezoelectric material element 22 is larger than or overhangs the mesa 12.

In contrast to FIG. 1, the mesa 12 shown in FIGS. 4 and 5 is comprised of two parts, a mesa edge support 26 and a mesa interior 28. The mesa edge support 26 comprises a rigid material able to withstand sufficient shear load placed upon it by the piezoelectric material element 22 and with a designed total structural stiffness of at least approximately twice the stiffness of the chamber diaphragm 10. The mesa edge support 26 serves as an anchoring point for the piezoelectric material element 22 to the chamber diaphragm 10. When the piezoelectric material element 22 expands or contracts, a rotational moment occurs about the mesa edge support 26. Examples of suitable materials for the mesa edge support 26 include using the same material used for the chamber diaphragm 10, stainless steel, ceramics, or the same material used for the piezoelectric material element 22. The mesa interior 28 can comprise any material, solid, liquid, or vaporous which has no greater stiffness than the chamber diaphragm 10 or the piezoelectric material element 22. Examples of suitable materials include vacuum, air, hydraulic fluids, porous ceramics, rubber, or plastics.

The mesa 12 may be made out of a variety of materials such as oxides, nitrides, polyimides, metals, ceramics, and whatever material is used for the chamber diaphragm 10 among others. The mesa thickness can be any size so long as the mesa 12 and the chamber diaphragm 10 can still be bent by the piezoelectric material element 22. The minimum mesa thickness Tm chosen should be such that the sum of the thicknesses of the mesa 12, insulative layer 40, and electrical interconnect layer 18 is greater than the sum of the thicknesses of the insulative layer 40, electrical interconnect layer 18, and the dielectric layer 20. This will assure that the piezoelectric material element 22 is in direct contact only on the surface of the mesa 12 and not the top of the dielectric layer 20. The mesa thickness Tm for a particular application will be determined by performance and manufacturability constraints. If the mesa thickness Tm is greater than approximately 10% of the chamber diaphragm thickness Tc, there is an added mechanical advantage to the piezoelectric material element 22. This is because expansion or contraction of the piezoelectric material element 22 will create a greater bending moment on the chamber diaphragm 10 when the piezoelectric material element 22 is further displaced from the neutral surface N of the diaphragm 10. The neutral surface N is defined as the surface within the diaphragm 10 and the adjoining structures, such as mesa 12, where the shear stress passes through zero. That is, the shear stresses are compressive on one side of the neutral surface N and tensile on the other. There are many combinations of dimensions and properties of the chamber diaphragm 10, mesa 12, and piezoelectric material element 22 that will provide acceptable performance characteristics.

Interposed between the mesa 12 and the piezoelectric material element 22 is an insulative layer 40 and an electrical interconnect layer 18. The insulative layer 40 may not be necessary and may be left out of some implementations. Some implementations may utilize a conductive chamber diaphragm 10 and mesa 12 as the electrical contact layer in which case both the insulative layer 40 and the additional electrical interconnect layer 18 may be omitted. Alternatively, if only the chamber diaphragm 10 or the mesa 12 is conductive then select portions of the electrical interconnect layer 18 and/or the insulative layer 40 may be omitted. The insulative layer 40 is used to insulate, if necessary, the chamber diaphragm 10 from any electrical signals carried on the electrical interconnect layer 18. The insulative layer 40 is commonly made out of dielectric materials having sufficient resistivity such that leakage currents are kept to an acceptably small value and with suitable mechanical properties such that the film remains intact over time and with acceptable manufacturability. Resistivities greater than $10^{10}$ ohm-cm are commonly used. Some examples of suitable dielectric materials include silicon dioxide, silicon nitride, silicon oxynitride, epoxy resins, polyimides and mylar layers although other materials may be used if they have suitable properties.

The chamber diaphragm 10 and chamber diaphragm support structure 34 may be made out of any material with adequate stiffness and strength and manufacturability. The material stiffness, as measured by well-know parameters such as mechanical elastic modulus and poisson ratio, would be chosen for a given application to best achieve design goals such as stiffness of the chamber 16, which is measured by pressure change per volume change of the chamber. For instance, silicon, polysilicon, silicon nitride, stainless steel or silicon dioxide are commonly used as diaphragms although other materials such as plastics, metals such as aluminum and nickel or others, glass, or epoxy resins may also be used. The chamber diaphragm 10 has two surfaces, a chamber diaphragm lower surface 36 which faces the chamber 16 and a chamber diaphragm upper surface 38 which is opposed to the chamber diaphragm lower surface 36 and faces the mesa 12.

The piezoelectric material element 22 may be made out of any material which is ferroelectric in nature or electrostrictive or any material which changes physical dimension as the electric field in the material is changed. For instance, various ceramic materials may be used such as lead-zirconate-titanate (PZT), lead-titanate (PbTiO2), barium-titanate (BaTiO3), lead-magnesium-niobium-titanate (PMNPT) or crystalline materials such as zinc-oxide (ZnO), aluminum-nitride (AlN), quartz, lithium-tantalate (LiTaO3) and lithium-niobate (LiNbO2). Any of these materials may be used in forms that are polycrystalline or single crystal in nature. Also polymeric materials such as polyvinylidene fluoride (PVDF) and its co-polymers or other polymers may be used.

The adhesive 14 for attaching the piezoelectric material element 22 to the mesa 12 can be any variety of adhesives having sufficient bonding strength and manufacturability characteristics such as viscosity, surface wetting, etc. Some examples are epoxy resins or acrylic resins or others. It should be noted that the adhesive 14 forms a very thin layer between the mesa 12 and the piezoelectric material element 22 but forms a thick cushion under the edges of the piezoelectric material element 22 where the piezoelectric material element 22 extends beyond the mesa 12. Adhesives which have an elastic modulus of approximately $\frac{1}{5}^{th}$ or less of the elastic modulus of the piezoelectric material element 22 will work with the mesa 12 to provide an effective piezoelectric material element 22 width equal to the mesa width Wm by allowing any portion of the piezoelectric material element 22 extending beyond the mesa 12 to flex freely without impacting the chamber diaphragm 10.

Although not necessary, the mesa 12 additionally may have a series of mesa openings 24 in the mesa edge support 26 and/or the mesa interior 28 if the mesa interior 28 is a solid material, as shown in FIGS. 4 and 5 to provide for enhanced bonding of the piezoelectric material element 22 to the mesa 12. The mesa openings are shown in FIG. 4 as extending substantially through the mesa 12 towards the chamber diaphragm 10 however, the mesa openings 24 need extend only partially into the mesa 12 to a depth of at least approximately 0.5 microns. The mesa openings 24 should be at least approximately 0.5 microns wide, evenly distributed and occupy no more than approximately 50% of the surface area of the mesa 12. As was illustrated hereinabove in the enlarged view of FIG. 2, the insulative layer 40 and the electrical interconnect layer 18 may partially fill the mesa openings 24. In that case, to compensate for this, the mesa openings 24 should be increased such that the resultant reservoir width Wr and reservoir depth Dr become at least approximately 0.5 microns. A top view of the mesa 12 is shown in FIG. 3. As can be seen, the mesa 12 may also have mesa grooves 30 connecting the mesa openings 24. The mesa grooves should also be at least approximately 0.5 microns wide.

The mesa openings 24 provide for enhanced bonding of the piezoelectric material element 22 to the mesa 12 by serving as an adhesive 14 reservoir during the bonding operation. This allows the adhesive 14 to be present in sufficient quantities to allow it to seep into the somewhat porous material of the piezoelectric material element 22 during the curing operation while retaining a sufficient quantity of the adhesive 14 to bond the piezoelectric material element 22 to the mesa 12. Therefore the volume of the mesa openings 24 and/or mesa grooves 30 should provide sufficient reservoir volume to supply the necessary adhesive 14. The particular size and depth of the mesa openings will be determined by the amount of adhesive reservoir needed, the viscosity of the adhesive, and manufacturing constraints. The mesa grooves 30 may further serve as an aid to avoid trapping air bubbles as the adhesive cures by providing a channel for air bubbles to escape.

The electrical interconnect layer 18 is for making electrical contact with the piezoelectric material element 22. The electrical interconnect layer 18 can be made out of a wide variety of conductive materials as is known in the art. For instance, nickel, aluminum, copper, titanium alloys, or indium tin oxide may be used although other materials having sufficient conductivity may also be used.

Electrical contact 32 is also shown for making electrical contact with the piezoelectric material element 22. The electrical contacts 24 can also be made out of a wide variety of conductive materials as is known in the art. For instance, aluminum, copper, gold, and nickel may be used although other materials having sufficient conductivity may also be used.

To facilitate electrical contact between the piezoelectric material element 22 and both electrical contact 32 and electrical interconnect layer 18, the piezoelectric material element 22 includes two electrical contact layers 42, 44 on opposing surfaces. The two electrical contact layers 42, 44 are pre-deposited conductive layers in intimate contact with the piezoelectric material element 22. The electrical contact layers 42, 44 can also be made out of a wide variety of conductive materials as is known in the art. For instance, nickel, aluminum, copper, titanium alloys, or indium tin oxide may be, used although other materials having sufficient conductivity may also be used.

It should be noted that although FIGS. 1–5 describe a piezoelectric transducer 1 with a mesa 12 and piezoelectric material element 22 attached to the chamber diaphragm upper surface 38, that an equivalent structure can be built utilizing a mesa 12 and piezoelectric material element 22 attached to the chamber diaphragm lower surface 36.

Figure 6:
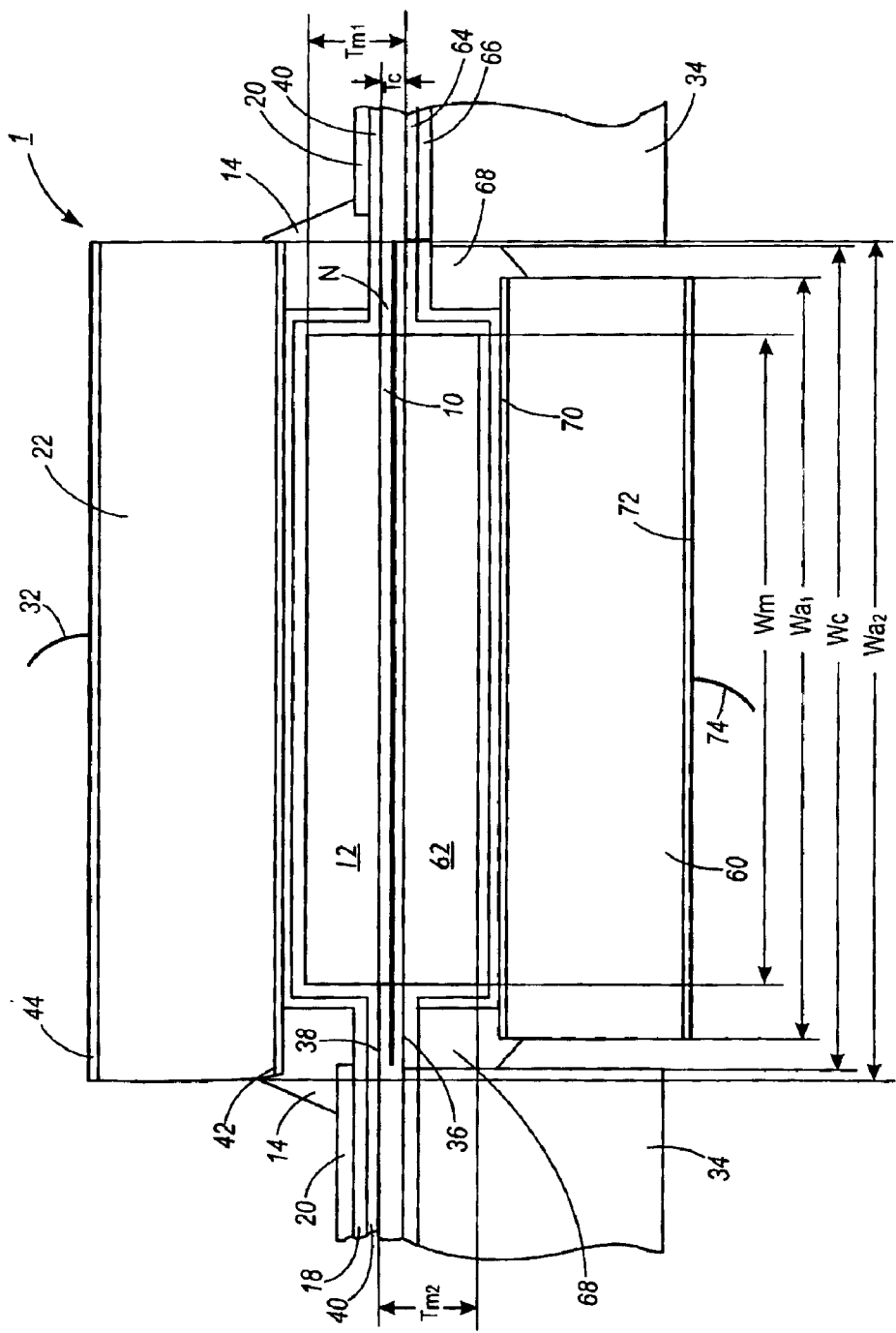
FIG. 6 is a cross-sectional view of a third embodiment of a piezoelectric transducer according to the present invention.

Turning now to FIG. 6, an alternative embodiment of a piezoelectric transducer 1 having a chamber diaphragm 10 over a chamber 16 with chamber support structure 34 is shown. It should be noted that the shape of the chamber diaphragm 10 and the piezoelectric material element 22 are for exemplary purposes only and many variants are possible.

In contrast to FIGS. 1–5, FIG. 6 shows a bimorphic structure having two mesas 12, 62 supporting two piezoelectric material elements 22, 60, one on the chamber diaphragm upper surface 38 and one on the chamber diaphragm lower surface 36. As many of the elements are the same as shown in FIGS. 1–5, the same reference numbers will be used to designate the same elements.

The chamber diaphragm 10 has a chamber diaphragm width Wc and a chamber diaphragm thickness Tc. The chamber diaphragm 10 is at least partially covered on the chamber diaphragm upper surface 38 by the mesa 12 having a mesa width Wm and a mesa thickness Tm1 and at least partially covered on the chamber diaphragm lower surface 36 by the mesa 62 having a mesa width also Wm and a mesa thickness Tm2. The mesa width Wm is shown as being less than the chamber diaphragm width Wc, however, the mesa widths Wm may each vary from approximately 50% of the chamber diaphragm width Wc to approximately 150% of the chamber diaphragm width Wc, although it should be noted that performance may be better from approximately 60% of the chamber diaphragm width Wc to approximately 100% of the chamber diaphragm width Wc. It should also be noted that while the mesa widths Wm are shown as being substantially the same, they need not be so and could vary considerably from one another.

The mesa 12 has a piezoelectric material element 22 bonded to it using an adhesive 14 while the mesa 62 has a piezoelectric material element 60 bonded to it using an adhesive 68. The piezoelectric material element 22 has a piezoelectric material width Wa1 and the piezoelectric material element 60 has a piezoelectric material width Wa2. The piezoelectric material widths Wa1, Wa2 are shown as being larger than both the mesa widths Wm and in the case of piezoelectric material element 22 larger than the chamber diaphragm width Wc. While the piezoelectric material widths Wa1, Wa2 are shown as being different, they may also be substantially the same. The piezoelectric material widths Wa1, Wa2 can be a variety of sizes and will be optimized for the process parameters and the ultimate function. For instance, it may be desired when building sensors that the piezoelectric material widths Wa1, Wa2 be small relative to the chamber diaphragm width Wc. It is also possible in some case for the piezoelectric material widths Wa1, Wa2 to be smaller that mesa widths Wm. It should be noted that while the mesa width Wm for both mesas 12, 62

The mesa width Wm, determines the effective attachment edge of the piezoelectric material elements 22, 60, respectively, when the piezoelectric material width Wa1, Wa2 is greater than the mesa width Wm. That is, even though the piezoelectric material width Wa1, Wa2 differs from its respective mesa width Wm, the chamber diaphragm 10 will react to the piezoelectric material element 22, 60 as if it had a piezoelectric material width Wa1, Wa2 equal to its respective mesa width Wm. This therefore defines an effective attachment perimeter and size of the piezoelectric material element 22, 60 to be the perimeter and size of its respective mesa 12, 60 regardless as to the actual shape and size of the piezoelectric material element 22, 60, as long as the piezoelectric material element 22, 60 is larger than or overhangs its respective mesa 12, 62. The mesas 12, 62 can be constructed and aligned more precisely to the chamber diaphragm 10, compared to the piezoelectric material elements 22, 60, due to common manufacturing methods which achieves an optimum positioning of the mesas 12, 62, and therefore optimum positioning and effective width of the piezoelectric material elements 22, 60 for a given chamber diaphragm width Wc, when the piezoelectric material elements 22, 60 are larger than or overhang their respective mesas 12, 62.

The mesas 12, 62 may be made out of a variety of materials such as the same material as used for the chamber diaphragm 10, oxides, nitrides, polyimides, metals and ceramics, among others. The mesa thickness can be any size so long as the mesas 12, 62 and the chamber diaphragm 10 can still be bent by the piezoelectric material elements 22, 60. The minimum mesa thickness Tm1 of mesa 12, when the piezoelectric material width Wa1 is greater than the mesa width Wm, should be chosen should be such that the sum of the thicknesses of the mesa 12, insulative layer 40, and electrical interconnect layer 18 is greater than the sum of the thicknesses of the insulative layer 40, electrical interconnect layer 18, and the dielectric layer 20. This will assure that the piezoelectric material element 22 is in direct contact only on the surface of the mesa 12 and not the top of the dielectric layer 20. The mesa thickness Tm2, and mesa thickness TM1 when the piezoelectric material width Wa1 is not greater than the mesa width Wm, has no minimum. It should be noted that it is possible to build the piezoelectric transducer 1 in a bimorphic configuration, such as shown in FIG. 6, utilizing only one mesa on one of the chamber diaphragm 10 surfaces, either chamber diaphragm upper surface 38 or chamber diaphragm lower surface 36, that is setting one of either mesa thickness Tm1 or mesa thickness Tm2 equal to zero. The mesa thicknesses Tm1, Tm2 used for a particular application will be determined by performance and manufacturability constraints. It should also be noted that although the mesa thicknesses Tm1, Tm2 are shown as being substantially the same, they need not be and may vary considerably from each other. If the mesa thickness Tm1, Tm2 is greater than approximately 10% of the chamber diaphragm thickness Tc, there is an added mechanical advantage to the respective piezoelectric material element 22, 60. This is because expansion or contraction of the piezoelectric material element 22 will create a greater bending moment on the chamber diaphragm 10 when the piezoelectric material element 22, 60 is further displaced from the neutral surface N of the diaphragm 10. The neutral surface N is defined as the surface within the diaphragm 10 and the adjoining structures, such as the mesas 12, 60, where the shear stress passes through zero. That is, the shear stresses are compressive on one side of the neutral surface N and tensile on the other. There are many combinations of dimensions and properties of the chamber diaphragm 10, mesa 12, and piezoelectric material element 22 that will provide acceptable performance characteristics.

FIGS. 1–5 show the mesa 12 with an additional features of mesa openings 24 and mesa grooves 30 to provide for enhanced bonding of the piezoelectric material element 22 to the mesa 12. While not shown in FIG. 6, these mesa features are also applicable to the piezoelectric transducer 1 shown in FIG. 6 and can be incorporated in a similar manner. It should be pointed out that if it is desired to use the additional mesa features of mesa openings 24 and mesa grooves 30, that they need not be used in both mesas 12, 60 but can be selectively used in only one of the mesas 12,60.

Interposed between the mesas 12, 62 and their respective piezoelectric material elements 22, 60 are an insulative layer 40, 64 and an electrical interconnect layer 18, 66, respectively. The insulative layers 40, 64 may not be necessary and may be left out of some implementations. Some implementations may utilize a conductive chamber diaphragm 10 and at least one of the mesas 12, 62 as the electrical contact layer in which case both the respective insulative layers 40, 64 and the additional electrical interconnect layers 18, 66 may be omitted. Alternatively, if only the chamber diaphragm 10 or at least one of the mesas 12, 60 is conductive then select portions of the respective electrical interconnect layers 18, 66 and/or the insulative layers 40, 64 may be omitted. The insulative layers 40, 64 are used to insulate, if necessary, the chamber diaphragm 10 from any electrical signals carried on the electrical interconnect layers 18, 66. The insulative layers 40 are commonly made out of dielectric materials having sufficient resistivity such that leakage currents are kept to an acceptably small value and with suitable mechanical properties such that the film remains intact over time and with acceptable manufacturability. Resistivities greater than $10^{10}$ ohm-cm are commonly used. Some examples of suitable dielectric materials include silicon dioxide, silicon nitride, silicon oxynitride, epoxy resins, polyimides and mylar layers although other materials may be used if they have suitable properties. It should be pointed out the insulative layers 64, 40 need not be made from the same material.

The chamber diaphragm 10 and chamber diaphragm support structure 34 may be made out of any material having adequate stiffness and strength and manufacturability. The material stiffness, as measured by well-know parameters such as mechanical elastic modulus and poisson ratio, would be chosen for a given application to best achieve design goals such as stiffness of the chamber 16, which is measured by pressure change per volume change of the chamber. For instance, silicon, polysilicon, silicon nitride, stainless steel or silicon dioxide are commonly used as diaphragms although other materials such as plastics, metals such as aluminum and nickel or others, glass, or epoxy resins may also be used.

The piezoelectric material elements 22, 60 may be made out of any material which is ferroelectric in nature or electrostrictive or any material which changes physical dimension as the electric field in the material is changed. For instance, various ceramic materials may be used such as lead-zirconate-titanate (PZT), lead-titanate (PbTiO2), barium-titanate (BaTiO3), lead-magnesium-niobium-titanate (PMNPT) or crystalline materials such as zinc-oxide (ZnO), aluminum-nitride (AlN), quartz, lithium-tantalate (LiTaO3) and lithium-niobate (LiNbO2). Any of these materials may be used in forms that are polycrystalline or single crystal in nature. Also polymeric materials such as polyvinylidene fluoride (PVDF) and its co-polymers or other polymers may be used. It should be noted that the piezoelectric material elements 22, 60 need not be made out of the same material.

The adhesives 14, 68 for attaching the piezoelectric material elements 22, 60 to their respective mesas 12, 62 can be any variety of adhesives having sufficient bonding strength and manufacturing characteristics such as viscosity, surface wetting, etc. Some examples are epoxy resins or acrylic resins or others. It should be noted that the adhesives 14, 68 form a very thin residual layer between the mesas 12, 62 and their respective piezoelectric material elements 22, 60 but forms a thick cushion under the edges of the piezoelectric material elements 22, 60 where the piezoelectric material elements 22, 60 extend beyond the respective mesas 12, 62. Adhesives which have an elastic modulus less than approximately ⅕ the elastic modulus of the piezoelectric material will work with the mesa 12 to provide an effective piezoelectric material element 22, 60 width equal to its respective mesa width Wm1, Wm2 by allowing any portion of the piezoelectric material elements 22, 60 extending beyond its respective mesa 12, 62 to flex freely without impacting the chamber diaphragm 10.

The electrical interconnect layers 18, 66 are for making electrical contact with the piezoelectric material elements 22, 60. The electrical interconnect layers 18, 66 can be made out of a wide variety of conductive materials as is known in the art. For instance, nickel, aluminum, copper, titanium alloys, or indium tin oxide may be used although other materials having sufficient conductivity may also be used. It should be noted that The electrical interconnect layers 18, 66 need not be made from the same material.

Electrical contacts 32, 74 are also shown for making electrical contact with the respective piezoelectric material elements 22, 60. The electrical contacts 32, 74 can also be made out of a wide variety of conductive materials as is known in the art, such as a wire bond as depicted in FIG. 1. For instance aluminum, copper, gold, and nickel may be used although other materials having sufficient conductivity may also be used. Again, it should be noted that electrical contacts 32, 74 need not be made using the same material.

To facilitate electrical contact between the piezoelectric material elements 22, 60 and their respective electrical contacts 32, 74 and electrical interconnect layers 18, 66, the piezoelectric material elements 22, 60 each include two electrical contact layers 42, 44, 70, 72 on opposing surfaces. The two electrical contact layers 42, 44, 70, 72 are pre-deposited conductive layers in intimate contact with the piezoelectric material elements 22, 60. The electrical contact layers 42, 44, 70, 72 can also be made out of a wide variety of conductive materials as is known in the art. For instance, nickel, aluminum, copper, titanium alloys, or indium tin oxide may be used although other materials having sufficient conductivity may also be used. Again, it should be noted that the electrical contact layers 42, 44, 70, 72 need not be made from the same material.

Figure 7:
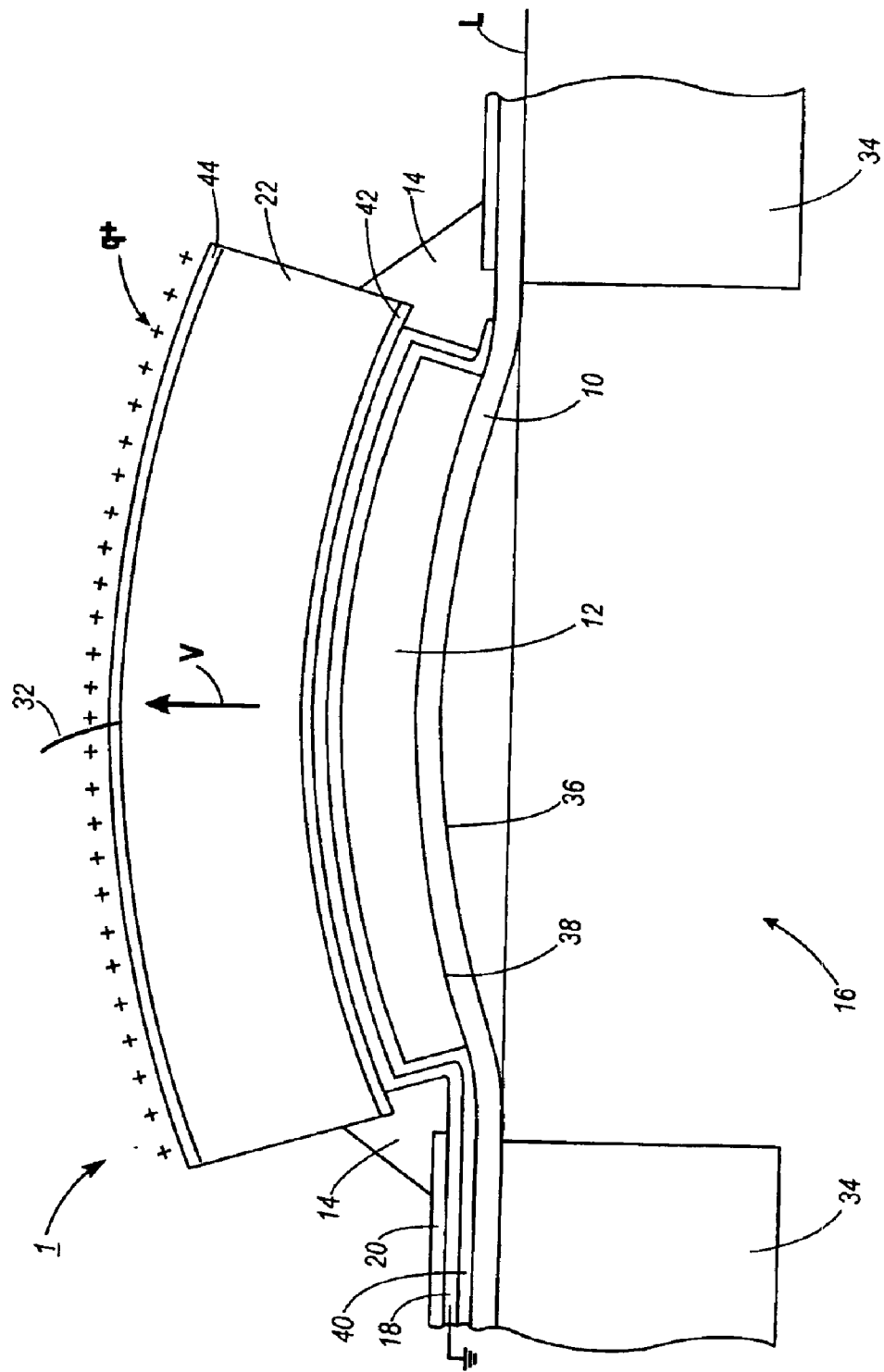
FIG. 7 is a cross-sectional view of a piezoelectric transducer of the present invention in a first operational state.
Figure 8:
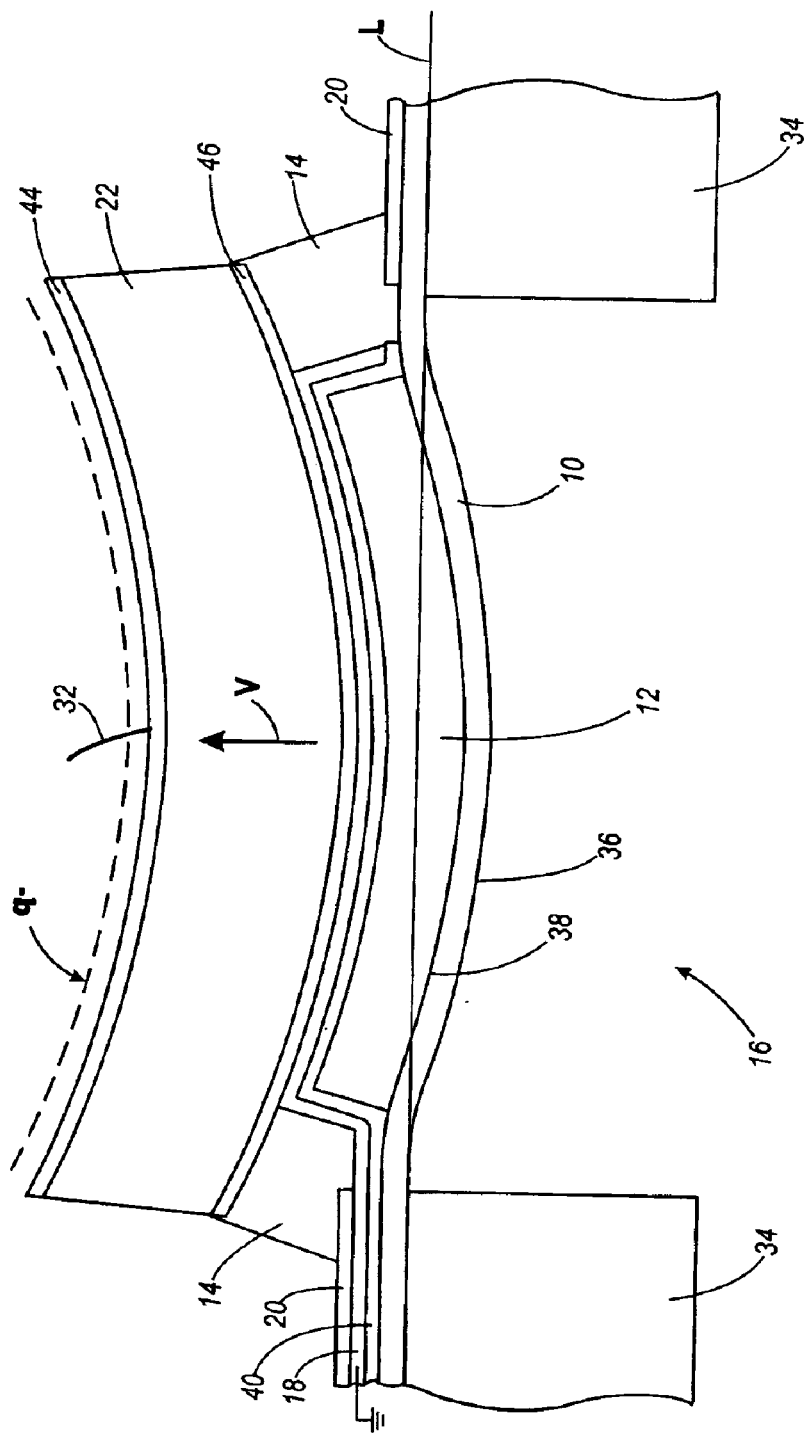
FIG. 8 is a cross-sectional view of a piezoelectric transducer of the present invention in a second operational state.

FIGS. 7 and 8 show the piezoelectric transducer 1 during an operational state. While the figures have been drawn depicting the embodiment shown in FIG. 2, the principles of operation apply to the other embodiments as known in the art. For the ease of description, some assumptions have been made about the operating conditions. For instance, a polarization vector V is shown in the piezoelectric material element 22 and certain voltage and charge conditions are shown. It should be noted that the system can also be operated if the polarization vector V is reversed although the voltage conditions will need to be reversed as well. Also, electrical interconnect layer 18 is shown connected to ground. It should be noted that electrical interconnect layer 18 need not be connected to ground, ground is merely used for ease of description of the voltage difference between electrical interconnect layer 18 and electrical contact 32. In other words, any arbitrary offset voltage may be used so long as the relative voltage differences between electrical interconnect layer 18 and electrical contact 32 are maintained.

FIG. 7 shows the condition where a positive voltage is applied to electrical contact 32. This results in a net positive charge q+ on the upper surface of piezoelectric material element 22 and an electric field across the piezoelectric material element 22. The piezoelectric material element 22 will respond with a net upward motion of the upper surface of the piezoelectric material element 22 caused by the extension of the piezoelectric material element 22 in the plane of the mesa 12 and the subsequent bending of the unimorph structure. The chamber diaphragm 10, electrical interconnect layer 18, insulative layer 40, and mesa 12 will also flex in an upward direction. For comparison, line L shows the previous position chamber diaphragm lower surface 36, when no voltages have been applied. As long as the field strength within the piezoelectric material element 22 remains less than approximately ⅓ of the coercive field of the piezoelectric material element 22 then the piezoelectric material element 22 will respond approximately linearly to the amount of positive voltage applied to the electrical contact 32. Higher voltages will result in a larger upward motion and smaller voltages will result in a smaller upward motion. If the field strength exceeds approximately $\frac{1}{3}$ of the coercive field the piezoelectric material element 22 will begin to show a non-linear response and the polarization of the piezoelectric material element 22 may degrade over time. The specific voltages used will depend on the system function, the characteristics of the piezoelectric material used, its thickness, the characteristics of chamber diaphragm 10, and the characteristics of the mesa 12.

Conversely, if the device is to be used as a sensor, a positive pressure applied to the chamber diaphragm lower surface 36 will result in the upward flexing of the chamber diaphragm 10 along with the insulative layer 40, the electrical interconnect layer 18, the mesa 12 and the piezoelectric material element 22. The upward flexing of the piezoelectric material element 22 will cause a net negative charge on the upper surface of the piezoelectric material element 22. The net negative charge can be determined using any conventional method, such as a voltmeter, and correlated with specific positive pressure.

FIG. 8 shows the condition where a negative voltage is applied to electrical contact 32. This results in a net negative charge q– on the upper surface of the piezoelectric material element 22 and an electric field across the piezoelectric material element 22. The piezoelectric material element 22 will respond with a net downward motion of the upper surface of the piezoelectric material element 22 caused by the contraction of the piezoelectric material element 22 in the plane of the mesa 12 and the subsequent bending of the unimorph structure The chamber diaphragm 10, electrical interconnect layer 18, insulative layer 40, and mesa 12 will also flex in an downward direction. For comparison, line L shows the previous position of the chamber diaphragm lower surface 36, when no voltages have been applied. As long as the magnitude of the field strength within the piezoelectric material element 22 remains less than approximately $\frac{1}{3}$ of the coercive field of the piezoelectric material element 22 the chamber diaphragm 10 will respond in an approximately linear way to the magnitude of the negative voltage applied to the electrical contact 32. More negative voltages will result in a larger downward motion and less negative voltages will result in a smaller downward motion. If the magnitude of the field strength exceeds approximately $\frac{1}{3}$ of the coercive field magnitude the piezoelectric material element 22 will begin to show a non-linear response. The specific voltages used will depend on the system function, the characteristics of the piezoelectric material used, its thickness, the characteristics of the chamber diaphragm 10, and the characteristics of the mesa 12.

Conversely, if the device is to be used as a sensor, a negative pressure, relative to ambient, applied to the chamber diaphragm lower surface 36 will result in the downward flexing of the chamber diaphragm 10 along with the insulative layer 40, the electrical interconnect layer 18, the mesa 12, and the piezoelectric material element 22. The downward flexing of the piezoelectric material element 22 will cause a net positive charge on the upper surface of the piezoelectric material 22. Again, the net positive charge can be determined using any conventional method, such as a voltmeter, and correlated with a specific negative pressure.

The structures described above can be made in a variety of ways using many well known processing techniques. To the extent that the description below relies on such manufacturing techniques what follows will be an outline of some of the manufacturing alternatives. It should be noted that not all of the processing techniques discussed herein may be applicable to every embodiment, and some embodiments may be preferably constructed with some methods and not others.

The chamber diaphragm 10 and the chamber support structure 34 which form the chamber 16 may be constructed first, with many methods possible. One method might be to laminate a stack of stainless steel parts, which have been chemically etched to define appropriate patterns. The stack can be laminated using well-known brazing processes. Alternatively, it may be advantageous to pre-process some or all of the structures on the chamber diaphragm before constructing the stack.

Alternatively, chamber diaphragm 10 and structure surrounding the chamber 16 could be made using silicon single crystal material, both doped and undoped, sapphire, crystals, or other materials that can be etched. One simple process for etching out the chamber 16 is to provide a top surface, which will become the chamber diaphragm 10 which acts as an etch stop. For instance, heavily doped silicon, oxides, or nitrides may be used. The chemical etchant can then be used to etch the chamber 16 from the bulk material with the assurance that the etch stop material will remain behind to form the chamber diaphragm 10. Further, the chamber diaphragm 10 and the structure surrounding the chamber 16 may be stamped or molded using any number of plastic materials or plastic composites or epoxy resins.

The criterion in selecting a material for the chamber diaphragm 10 and the chamber support structure 34 are materials suitable for the environment the final structure is to be used in, ease of manufacturability, suitability for subsequent process steps, and appropriate stiffness, commonly described by mechanical elastic modulus and poisson ratio characteristics. In particular, the stiffness of the chamber diaphragm 10 should be similar to the stiffness characteristics of the piezoelectric material element to be utilized. A stiffness ratio of $\frac{1}{100}$th to 100 relative to the piezoelectric material element can be used, although it should be noted that there may be some performance degradation as the values diverge.

The mesa or mesas may be formed using a variety of methods. If the mesa is to be made from a selectively etchable material, such as dielectric materials, metals, oxides, nitrides, polyimides, and ceramics, among others then the dielectric or other material may be deposited using any well known deposition technique such as CVD deposition, sputtering, or spin coating & curing. Once the material has been deposited, the mesa, and openings for the mesa interior, the mesa openings and the mesa grooves, if desired, may be made by using standard photolithography and etching processes. If the material used for the mesa is photosensitive, such as some polyimides or SU-8 materials or others, then patterning may be done with well known photolithographic processes without the need for etching.

If a mesa interior has been etched, then the mesa interior can be filled with any material, solid, liquid, or vaporous which has no greater stiffness than the chamber diaphragm or the piezoelectric material element such as air, hydraulic fluids, porous ceramics, rubber, or plastics. The mesa interior may be filled by simply allowing the ambient air or vacuum or adhesive material to fill the chamber when the piezoelectric material element is bonded to the mesa. If the mesa interior is filled with a solid material it may be desirable to form mesa openings and mesa grooves in the mesa interior as well as the mesa edge support. The mesa openings and the mesa grooves may be made by using standard photolithography and etching processes.

The insulative layer can then be deposited on the chamber diaphragm using any of the well known thin film deposition techniques such as CVD deposition, sputtering, or spin coating & curing. The insulative layer can then be patterned using standard photolithography and etching processes.

The electrical interconnect layer can then be deposited using any one of a variety of conventional techniques, such as sputtering, evaporation, or plating. If the electrical interconnect layer is to be a patterned layer then the insulative layer and other layers at the surface may be masked prior to deposition of the electrical interconnect layer or the electrical interconnect layer may be masked and etched after deposition using standard photolithography and etching processes.

A dielectric layer may then be deposited on the electrical interconnect layer and other surface layers using any of the well known thin film deposition techniques such as CVD deposition, sputtering, or spin coating & curing. It can then be patterned using standard photolithography and etching processes.

Next the piezoelectric material element is attached. The piezoelectric material element may be purchased from a variety of vendors that make such parts. It may be necessary prior to attachment to apply a conductive material to two sides of the piezoelectric material element for the electrical contact layers if not already done by the vendor. These conductive layers could be formed using any of the well known processes of vacuum deposition, plating, screen printing to the surface and firing, or others. The piezoelectric material element may then be attached to the mesa using standard liquid or B-staged epoxies to adhere the elements to the surface of the mesa, solders, thin film epoxies or other means.

However, if the mesa has mesa openings then the following process should be used to attach the piezoelectric material element to the mesa for increased bonding strength between the mesa and the piezoelectric material element. The following bonding process is not limited to the bonding of a piezoelectric material element to a mesa but may be utilized to bond any porous material which has porosity less than approximately 10% to a hard substrate, and will be described accordingly.

Figure 9:
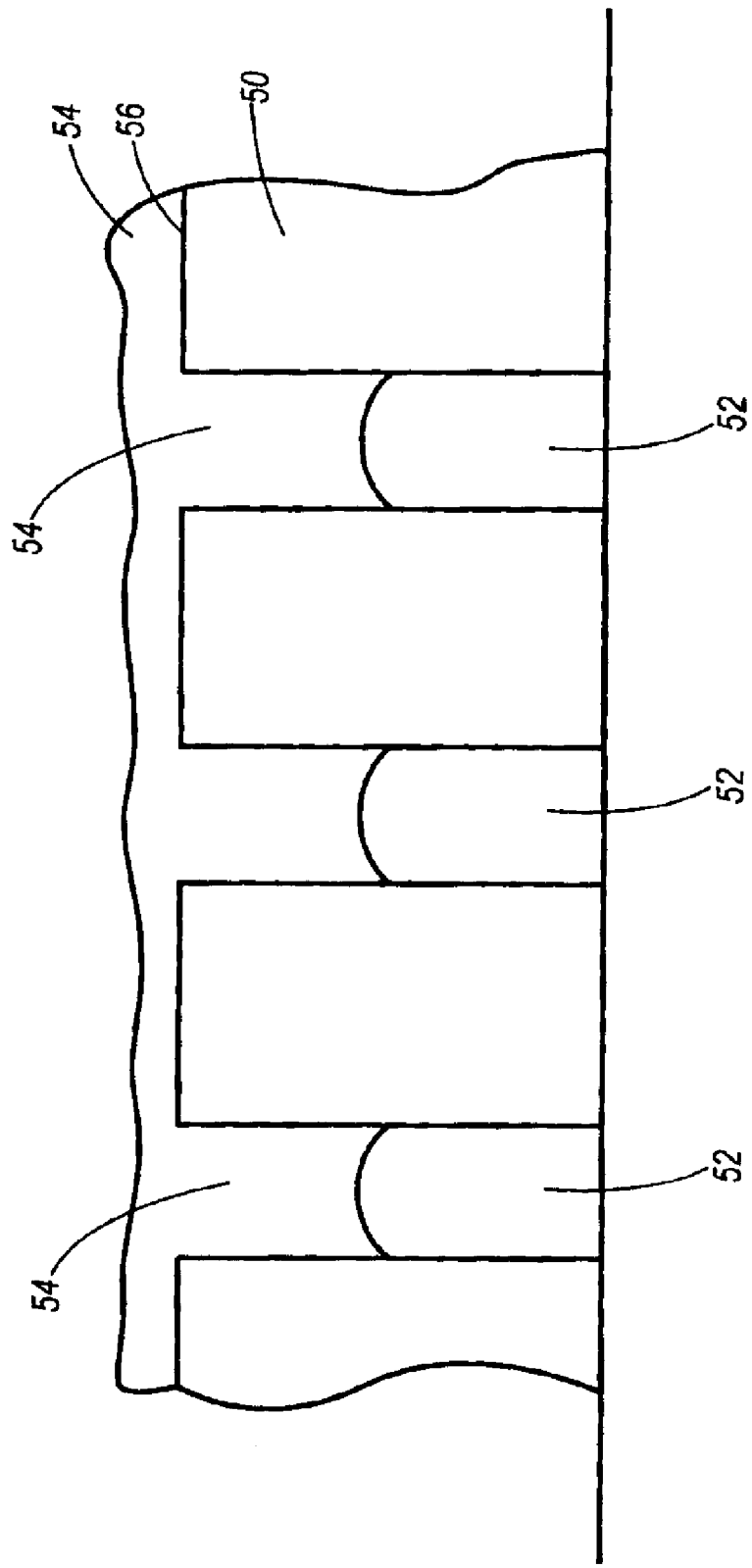
FIG. 9 is a cross-sectional view of a first step of a bonding process to bond a porous material to a substrate.

FIG. 9 shows a cross-sectional view of a substrate 50 with substrate apertures 52. It should be noted that substrate 50 may be an intermediate substrate used for bonding purposes to achieve a good bond between the porous material and yet another substrate. For instance, the substrate 50 may be a thin film layer or other intermediate layer. The substrate 50 can comprise a variety of materials having characteristics similar to those used for diaphragms above such as oxides, nitrides, polyimides, metals and ceramics, or any rigid material. Adhesive 54 has been dispensed in any conventional manner to the substrate top surface 56 and may at least partially fill the substrate apertures 52. If the substrate apertures 52 are not filled in this step then they should fill in the subsequent step. The volume of adhesive material located in the apertures should be at least as much as required to counteract the absorption of adhesive into the porous material 58 to be attached The adhesive 54 should be chosen to be viscous enough when dispensed to for sufficient amounts to remain on the substrate top surface 56 while allowing some adhesive 54 to flow at least partially into the substrate apertures 52. The substrate apertures 52 are shown extending through the substrate 50 however the substrate apertures 52 need extend only partially into the substrate 50 to a depth to provide a sufficient reservoir of adhesive during the curing process. A depth of at least approximately 0.5 microns is believed to be sufficient for some adhesives. The substrate apertures should be at least approximately 0.5 microns wide, evenly distributed and occupy no more than approximately 50% of the substrate top surface 56.

Figure 10:
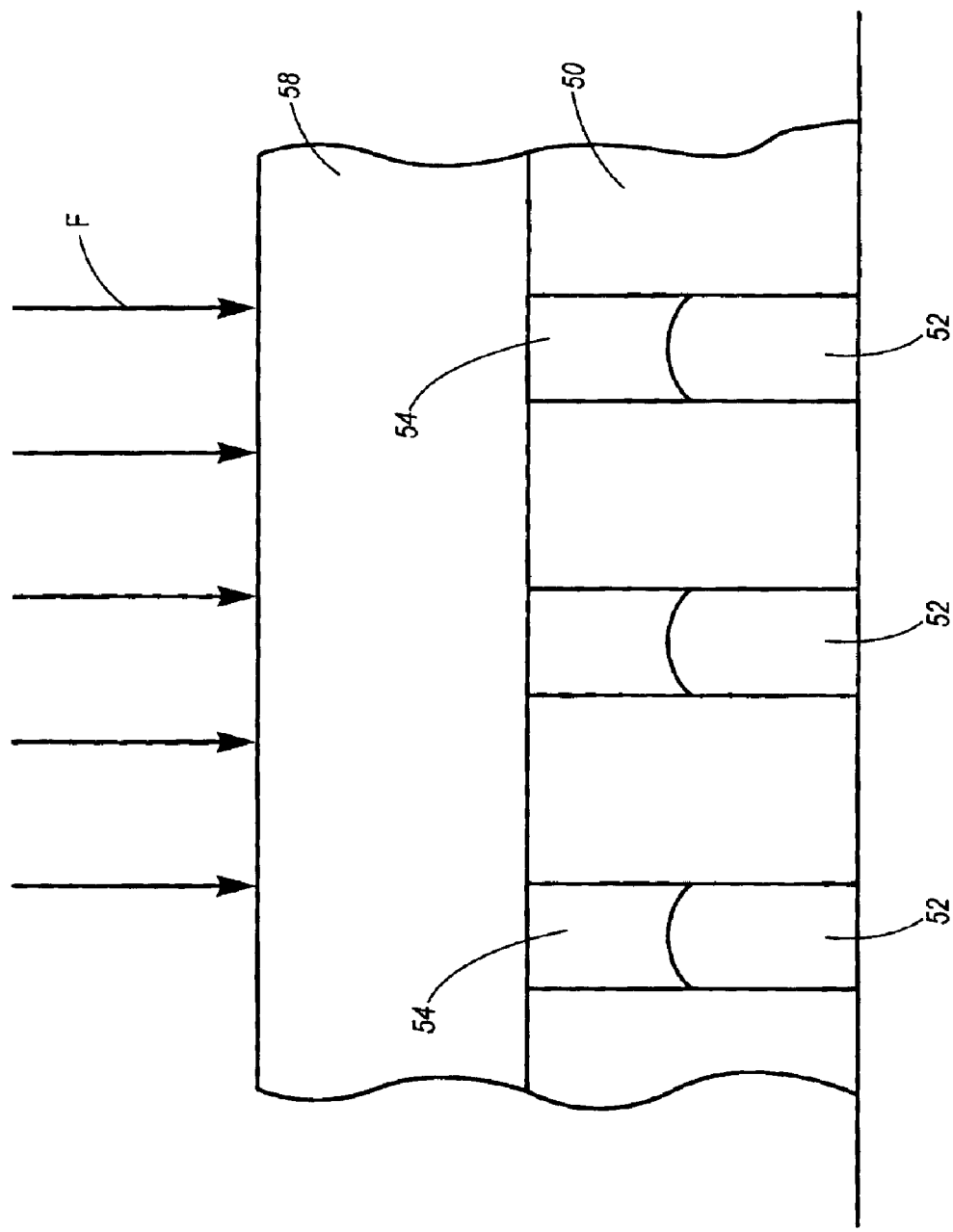
FIG. 10 is a cross-sectional view of a second step of a bonding process to bond a porous material to a substrate.

FIG. 10 shows a cross-sectional view of the substrate 50 with a porous material 58 placed next to the substrate top surface 56 with a force F being applied to the porous material 58 to push the porous material 58 and the substrate 50 together. The force F should be sufficient to extrude most of the adhesive on the substrate top surface 56, leaving only a residue of adhesive 54 between the substrate 50 and the porous material 58 and that portion of the adhesive which resides in the substrate apertures 52. If the adhesive did not at least partially fill the substrate apertures 52 in the prior dispensing step, then the adhesive should at least partially fill the substrate apertures 52 at the conclusion of this step. For instance, a force of 130 psi has been found to be sufficient for some adhesives. However the actual force used will depend greatly on the characteristics of the adhesive, such as viscosity, and may vary from approximately 1 psi upwards. It should be noted that while FIG. 10 shows the force F being applied on the porous material 58, that the force F could equally well be applied to the substrate 50 or both the substrate 50 and the porous material 58.

Figure 11:
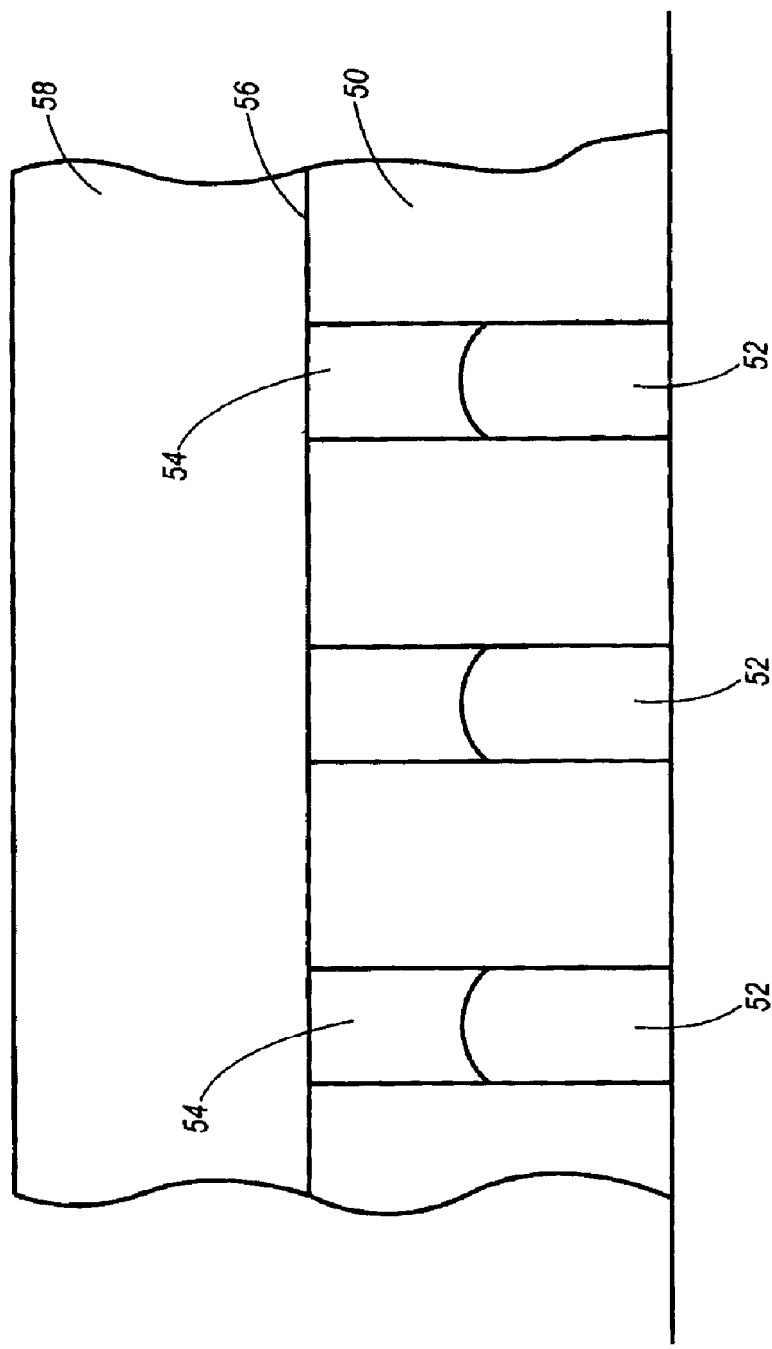
FIG. 11 is a cross-sectional view of the completed bonded product shown in FIGS. 8 and 9.

FIG. 11 shows the completed bond after curing of the adhesive 54. During the curing operation, the adhesive 54 should remain flowable for a short period of time sufficient for some of the adhesive to wick and/or squeeze from the substrate apertures 52 into the porous material 58. There should be a sufficient quantity of the adhesive 54 in the substrate apertures 52 to insure that some adhesive will remain in the substrate apertures 52 to bond the porous material 58 to the substrate top surface 56. If all of the adhesive 54 is absorbed into the porous material 58 then the resultant bond will be weak.

Finally electrical contacts are made. The electrical contact can be made using a variety of well-known techniques such as wire bonding, fuzz buttons or spring contacts.

If the piezoelectric material element was not poled prior to attachment, then after the construction is complete, the electrical contact and the electrical interconnect layer can be used to pole the piezoelectric material element. It should be noted that if poling of the piezoelectric material element is done after completion of the structure, it may be necessary to immerse the structure in a non-conducting fluid, such as certain oils or fluorinated hydrocarbons, to prevent arcing during the poling.

What is claimed is:

1. A piezoelectric transducer comprising:
   a) a chamber diaphragm having first and second opposing surfaces, a given chamber diaphragm thickness, and a given chamber diaphragm width,
   b) a mesa having first and second opposing surfaces, a given mesa thickness, and a given mesa width wherein the first surface of the mesa is adjacent to the first surface of the chamber diaphragm and the mesa further comprises at least one mesa opening, and
   c) a piezoelectric material element having a given piezoelectric material element width adjacent to the second surface of the mesa.

2. The piezoelectric transducer of claim 1 wherein the mesa further comprises an insulative layer at least partially on the second surface of the mesa.

3. The piezoelectric transducer of claim 1 further comprising an electrical contact layer at least partially interposed between the piezoelectric material element and the second surface of the mesa.

4. The piezoelectric transducer of claim 1 wherein the mesa comprises a substantially insulative material.

5. The piezoelectric transducer of claim 1 wherein the mesa comprises a substantially conductive material.

6. The piezoelectric transducer of claim 1 wherein the chamber diaphragm comprises a substantially conductive material.

7. The piezoelectric transducer of claim 1 wherein the chamber diaphragm comprises a substantially non-conductive material.

8. The piezoelectric transducer of claim 1 wherein at least a portion of the at least one mesa openings is at least partially filled with adhesive.

9. The piezoelectric transducer of claim 1 wherein the mesa further comprises at least one mesa groove.

10. The piezoelectric transducer of claim 9 wherein the mesa groove extends between at least two mesa openings.

11. The piezoelectric transducer of claim 1 wherein the mesa thickness is at least approximately 10% of the chamber diaphragm thickness.

12. The piezoelectric transducer of claim 1 wherein the mesa width is less than the chamber diaphragm width.

13. The piezoelectric transducer of claim 1 wherein the piezoelectric material element width is greater than the mesa width.

14. The piezoelectric transducer of claim 13 wherein the piezoelectric material element width is greater than the chamber diaphragm width.

15. The piezoelectric transducer of claim 1 wherein the mesa further comprises a mesa edge support and a mesa interior.

16. The piezoelectric transducer of claim 15 wherein the mesa edge support further comprises at least one mesa opening.

17. The piezoelectric transducer of claim 16 wherein at least a portion of the at least one mesa opening is at least partially filled with adhesive.

18. The piezoelectric transducer of claim 15 wherein the mesa edge support further comprises at least one mesa groove.

19. The piezoelectric transducer of claim 18 wherein the mesa groove extends between at least two mesa openings.

20. The piezoelectric transducer of claim 15 wherein the mesa interior further comprises air.

21. The piezoelectric transducer of claim 15 wherein the mesa interior further comprises a fluid.

22. The piezoelectric transducer of claim 15 wherein the mesa interior further comprises a solid.

23. The piezoelectric transducer of claim 15 wherein the mesa interior further comprises at least one mesa opening.

24. The piezoelectric transducer of claim 23 wherein at least one mesa opening is at least partially filled with adhesive.

25. The piezoelectric transducer of claim 15 wherein the mesa interior further comprises at least one mesa groove.

26. The piezoelectric transducer of claim 15 wherein the mesa edge support further comprises at least one mesa groove.

27. The piezoelectric transducer of claim 26 wherein the mesa groove extends between at least two mesa openings.

28. The piezoelectric transducer of claim 1 further comprising a second piezoelectric material element having a second piezoelectric material element width adjacent to the second surface of the chamber diaphragm.

29. The piezoelectric transducer of claim 28 further comprising a second mesa having first and second opposing surfaces, a given mesa thickness, and a given mesa width interposed between the second piezoelectric material element and the second surface of the chamber diaphragm.

30. The piezoelectric transducer of claim 29 wherein the second mesa further comprises an insulative layer at least partially on the second surface of the mesa.

31. The piezoelectric transducer of claim 29 further comprising an electrical contact layer at least partially interposed between the second piezoelectric material element and the second mesa.

32. The piezoelectric transducer of claim 28 wherein the second mesa comprises a substantially insulative material.

33. The piezoelectric transducer of claim 28 wherein the second mesa comprises a substantially conductive material.

34. The piezoelectric transducer of claim 28 wherein the second chamber diaphragm comprises a substantially conductive material.

35. The piezoelectric transducer of claim 28 wherein the second chamber diaphragm comprises a substantially non-conductive material.

36. The piezoelectric transducer of claim 29 wherein the second mesa further comprises a plurality of mesa openings.

37. The piezoelectric transducer of claim 36 wherein at least a portion of the plurality of mesa openings are at least partially filled with adhesive.

38. The piezoelectric transducer of claim 29 wherein the mesa further comprises at least one mesa groove.

39. A piezoelectric transducer comprising:
  a) a chamber diaphragm having first and second opposing surfaces, a given chamber diaphragm thickness, and a given chamber diaphragm width,
  b) a mesa having first and second opposing surfaces, a given mesa thickness, and a given mesa width wherein the first surface of the mesa is adjacent to the first surface of the chamber diaphragm and the mesa further comprises a plurality of mesa openings, and
  c) a piezoelectric material element having a given piezoelectric material element width adjacent to the second surface of the mesa, and
  d) an electrical interconnect layer interposed between the chamber diaphragm and the mesa.

40. A piezoelectric transducer comprising:
  a) a chamber diaphragm having first and second opposing surfaces, a given chamber diaphragm thickness, and a given chamber diaphragm width,
  b) mesa having first and second opposing surface, a given mesa thickness, and a given mesa width wherein the first surface of the mesa is adjacent to the first surface of the chamber diaphragm and the mesa further comprises a plurality of mesa openings, and
  c) first and second piezoelectric material elements, each element having a given piezoelectric material element width wherein the first piezoelectric element is adjacent to the second surface of the mesa and the second piezoelectric element is adjacent to second surface of the chamber diaphragm.

* * * * *